United States Patent
Wang et al.

(10) Patent No.: US 12,482,915 B2
(45) Date of Patent: Nov. 25, 2025

(54) TRANSFORMER BASED SERIES DOHERTY POWER AMPLIFIER

(71) Applicant: Apple Inc., Cupertino, CA (US)

(72) Inventors: Fei Wang, Santa Clara, CA (US); Xiang Guan, Santa Clara, CA (US)

(73) Assignee: Apple Inc., Cupertino, CA (US)

(*) Notice: Subject to any disclaimer, the term of this patent is extended or adjusted under 35 U.S.C. 154(b) by 272 days.

(21) Appl. No.: 18/136,168

(22) Filed: Apr. 18, 2023

(65) Prior Publication Data

US 2024/0356192 A1 Oct. 24, 2024

(51) Int. Cl.
| | |
|---|---|
| H03F 1/02 | (2006.01) |
| H01P 5/12 | (2006.01) |
| H03F 1/56 | (2006.01) |
| H03F 3/195 | (2006.01) |
| H03F 3/24 | (2006.01) |

(52) U.S. Cl.
CPC ............. H01P 5/12 (2013.01); H03F 3/245 (2013.01); *H03F 2200/451* (2013.01)

(58) Field of Classification Search
CPC ...... H01P 5/12; H03F 3/245; H03F 2200/451; H03F 1/0288; H03F 1/565; H03F 3/195; H03F 2200/537; H03F 2200/541
See application file for complete search history.

(56) References Cited

U.S. PATENT DOCUMENTS

| | | | |
|---|---|---|---|
| 8,736,398 B2 | 5/2014 | Caron et al. | |
| 8,994,488 B2 | 3/2015 | Lai | |
| 9,450,546 B2 | 9/2016 | Sivadas et al. | |
| 9,667,206 B2 | 5/2017 | Anderson et al. | |
| 10,432,146 B2 | 10/2019 | Sun et al. | |
| 10,910,714 B2* | 2/2021 | Ku | H03F 1/56 |

(Continued)

FOREIGN PATENT DOCUMENTS

| | | | | |
|---|---|---|---|---|
| CN | 107565909 A | * | 1/2018 | ........... H03F 1/0288 |
| CN | 114142203 A | * | 3/2022 | ............. H03F 3/213 |

(Continued)

OTHER PUBLICATIONS

Nawaf Almotairi, Millimeter Wave Series Connected Doherty PA Using 45 nm SOI Process, University of Waterloo (Year: 2018).*

(Continued)

*Primary Examiner* — Mohammed Rachedine
(74) *Attorney, Agent, or Firm* — Fletcher Yoder, P.C.

(57) ABSTRACT

This disclosure is directed to a series Doherty power amplifier including two-transformers. The series Doherty combiner may include a first branch including a main amplifier and a first transformer coupled to a load. In particular, a primary inductor of the first transformer may be coupled to the main amplifier and a secondary inductor of the first transformer may couple to the load. The series Doherty combiner may also include a second branch including an auxiliary amplifier and a second transformer coupled to the secondary inductor of the first transformer. The second transformer may couple to the load via the secondary inductor of the first transformer. As such, the load is coupled in series to the first branch and is coupled in series to the second branch. Moreover, the load is coupled in shunt to the main amplifier and the auxiliary amplifier.

20 Claims, 9 Drawing Sheets

(56) References Cited

U.S. PATENT DOCUMENTS

| | | | | |
|---|---|---|---|---|
| 11,716,056 | B2* | 8/2023 | Dinc | H03F 1/02 |
| | | | | 330/252 |
| 11,742,819 | B1* | 8/2023 | Wright | H03F 3/45 |
| | | | | 333/24 R |
| 2017/0294885 | A1* | 10/2017 | Kang | H04B 1/04 |
| 2022/0109405 | A1 | 4/2022 | Khalili et al. | |
| 2022/0278651 | A1* | 9/2022 | Khlat | H03F 1/56 |
| 2023/0253937 | A1* | 8/2023 | Tanaka | H03F 3/68 |
| | | | | 455/73 |
| 2024/0113739 | A1* | 4/2024 | Dinc | H04B 1/18 |

FOREIGN PATENT DOCUMENTS

| | | | | | |
|---|---|---|---|---|---|
| WO | WO-2023101476 | A1 * | 6/2023 | ............ | H03F 3/602 |
| WO | WO-2023157725 | A1 * | 8/2023 | ............ | H03F 3/245 |

OTHER PUBLICATIONS

Almotaiti, "Millimetre Wave Series Connected Doherty PA Using 45nm SOI Process," 2018, Waterloo, Ontario, Canada, 84 Pages.

Wang et al, "A High-Power Broadband Multi-Primary DAT-Based Doherty Power Amplifier for mm-Wave 5G Applications," Jun. 2021, IEEE Journal of Solid-State Circuits, vol. 56, No. 6, pp. 1668-1681.

Zong et al, "A 28-GHz SOI-CMOS Doherty Power Amplifier With a Compact Transformer-Based Output Combiner," Jun. 2021, IEEE Transactions on Microwave Theory and Techniques, vol. 69, No. 6, pp. 2795-2808.

Wang et al., "A Super-Resolution Mixed-Signal Doherty Power Amplifier for Simultaneous Linearity and Efficiency Enhancement," Dec. 2019, IEEE Journal of Solid-State Circuits, vol. 54, No. 12, pp. 3421-3436.

Hu et al., "A 28-/37-/39-GHz Linear Doherty Power Amplifier in Silicon for 5G Applications," Jun. 2019, IEEE Journal of Solid-State Circuits, vol. 54, No. 6, pp. 1586-1599.

Park et al., "Single Transformer-Based Compact Doherty Power Amplifiers for 5G RF Phased-Array ICs," May 2022, IEEE Journal of Solid-State Circuits, vol. 57, No. 5, pp. 1267-1279.

Wang, et al., "Millimeter-Wave Power Amplifier Integrated Circuits for High Dynamic Range Signals," IEEE Journal of Microwaves, vol. 1, No. 1, pp. 299-316, Jan. 2021, doi: 10.1109/JMW.2020.3035897.

F. Wang et al., "A Broadband Linear Ultra-Compact mm-Wave Power Amplifier With Distributed-Balun Output Network Analysis and Design," in IEEE Journal of Solid-State Circuits, vol. 56, No. 8, pp. 2308-2323, Aug. 2021, doi: 10.1109/JSSC.2021.3078485.

* cited by examiner

TRANSFORMER BASED SERIES DOHERTY POWER AMPLIFIER

BACKGROUND

The present disclosure relates generally to wireless communication, and more specifically to amplifiers of transmitter circuits.

In some applications, such as high frequency (e.g., millimeter wave (mmWave)) applications, an electronic device may form narrow beams to transmit radio frequency (RF) signals. In particular, the electronic device may include an increased number of antennas and respective data communication chains to form the narrower beams. The data communication chains may occupy an increased integrated circuit area and may generate transmission signals with reduced power consumption efficiency and/or signal linearity, which may be undesired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a power combiner circuit is described. The power combiner may include a first branch including a first amplifier (e.g., first power amplifier) and a first transformer coupled to a first amplifier, a second branch including a second amplifier and a second transformer (e.g., second power amplifier) coupled to the second amplifier and the first transformer, and a shunt capacitor coupled to the first transformer and the second transformer.

In another embodiment, an electronic device is described. The electronic device may include one or more antennas and a power combiner circuit. The power combiner circuit may include a first branch including a first amplifier and a first transformer coupled to the first amplifier, where the first transformer may be coupled to the one or more antennas, a second branch including a second amplifier and a second transformer coupled to the second amplifier and the first transformer, and a shunt capacitor coupled to the first transformer and the second transformer.

In yet another embodiment, a power combiner circuit is described. The power combiner circuit may include a first branch including a first amplifier and a first transformer coupled to the first amplifier, a second branch including a second amplifier and a second transformer coupled to the second amplifier and the first transformer, a series inductor coupled to the first transformer and the second transformer, a first shunt capacitor coupled to the first transformer and the series inductor, and a second shunt capacitor coupled to the second transformer and the series inductor.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to a series Doherty power amplifier with transformers, hereinafter generally referred to as a power amplifier. For example, an electronic device may include the power amplifier to transmit signals at high frequency (e.g., millimeter Waves (mmWaves)) applications. In some embodiments, the electronic device may transmit the signals at multiple frequency channels (e.g., about 24-30 gigahertz. (GHz), about 37-49 GHZ, higher than 50 GHZ, among other possibilities). Moreover, the power amplifier may have reduced size and improved efficiency and linearity at power back-off mode compared to other power amplifiers.

Figure 1:
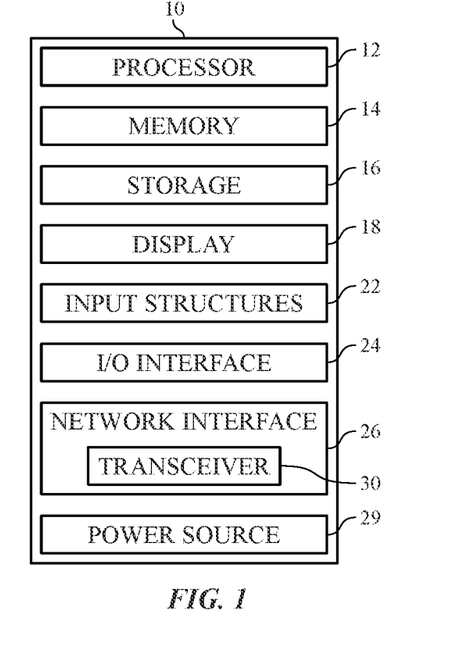
FIG. 1 is a block diagram of an electronic device, according to embodiments of the present disclosure.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), 4th generation (4G) cellular network, Long Term Evolution® (LTE) cellular network, Long Term Evolution License Assisted Access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 GHZ) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
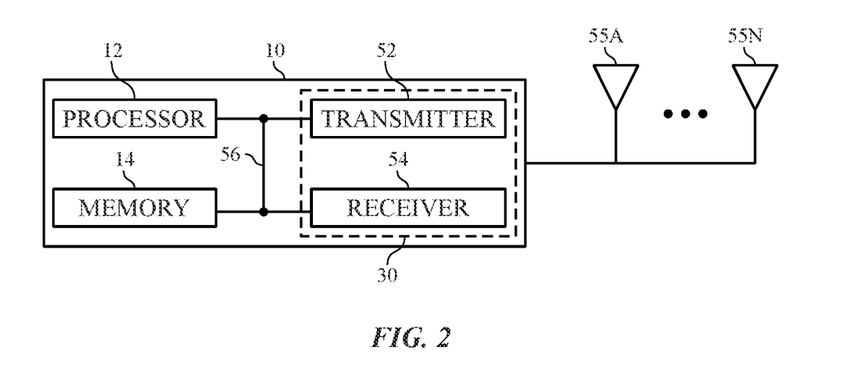
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have the antennas 55 electrically coupled to the transceiver 30. The antennas 55 may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55 (e.g., an antenna group or module) may be communicatively coupled to a respective transceiver 30. In such embodiments, each antenna 55 may emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
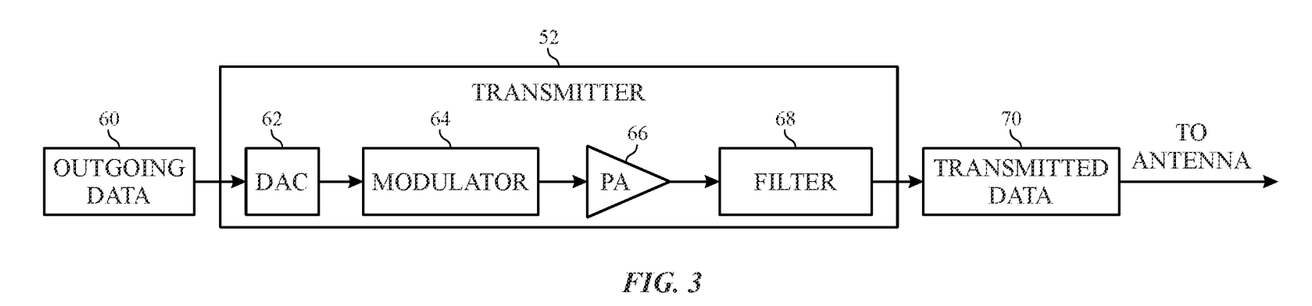
FIG. 3 is a schematic diagram of a transmitter of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the antennas 55. A digital-to-analog converter (DAC) 62 of the transmitter 52 may convert the digital signal to an analog signal, and a modulator 64 may combine the converted analog signal with a carrier signal to generate a radio wave.

A power amplifier (PA) 66 receives the modulated signal from the modulator 64. The power amplifier 66 may amplify the modulated signal to a suitable level to drive transmission of the signal via the antennas 55. In some embodiments, the power amplifier 66 may include a Doherty power amplifier, as will be appreciated.

A filter 68 (e.g., filter circuitry and/or software) of the transmitter 52 may then remove undesirable noise from the amplified signal to generate transmitted signal 70 to be transmitted via the antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

Figure 5A:
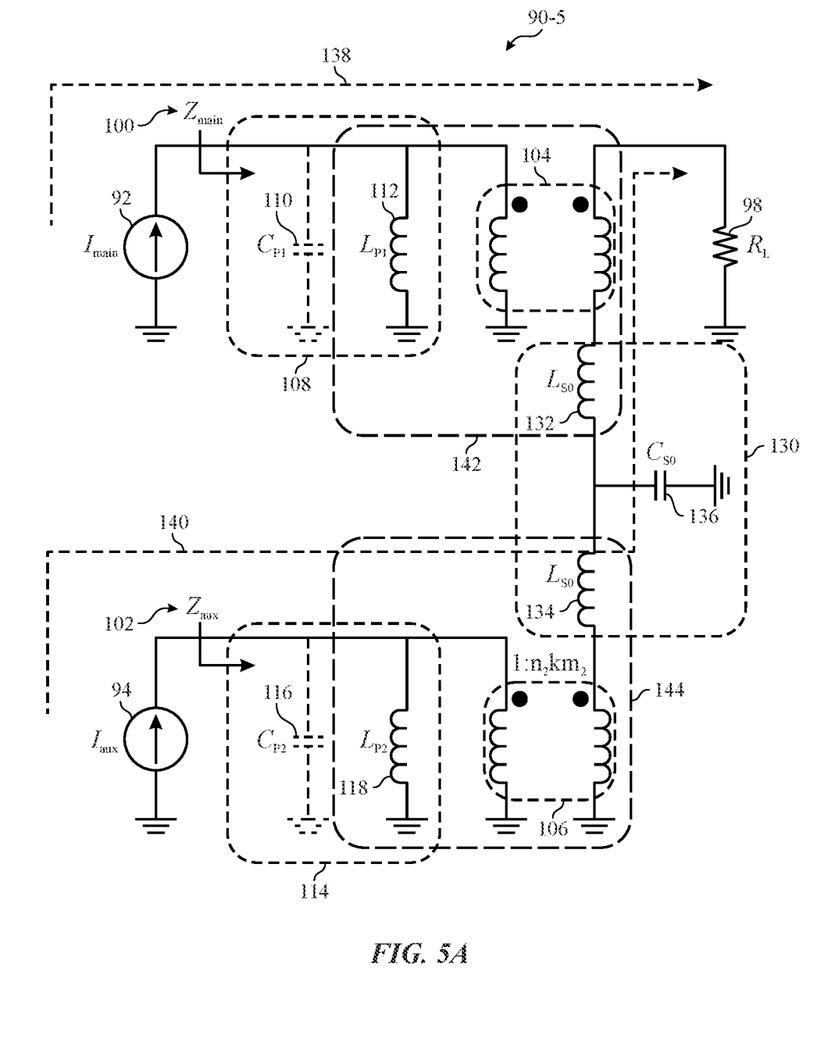
FIG. 5A is a schematic diagram of a series Doherty combiner of FIG. 4D having the impedance inverter implemented with an inductor-capacitor-inductor T-network on the secondary inductor of the ideal transformers, according to embodiments of the present disclosure.
Figure 5B:
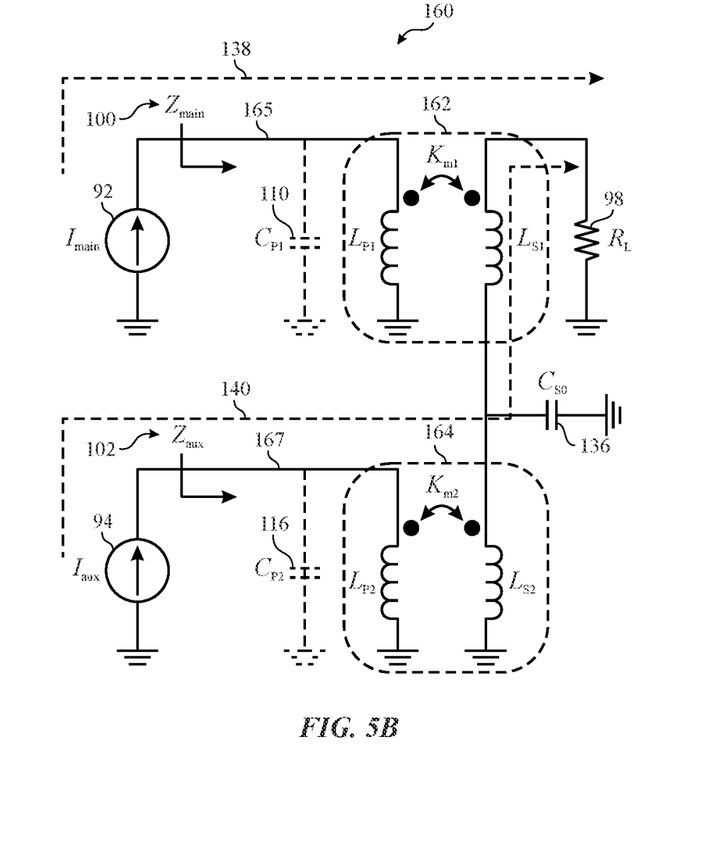
FIG. 5B is a first embodiment of a series Doherty power amplifier with transformers based on the series Doherty combiner of FIG. 5B including the inductor-capacitor-inductor T-network, according to embodiments of the present disclosure.
Figure 6A:
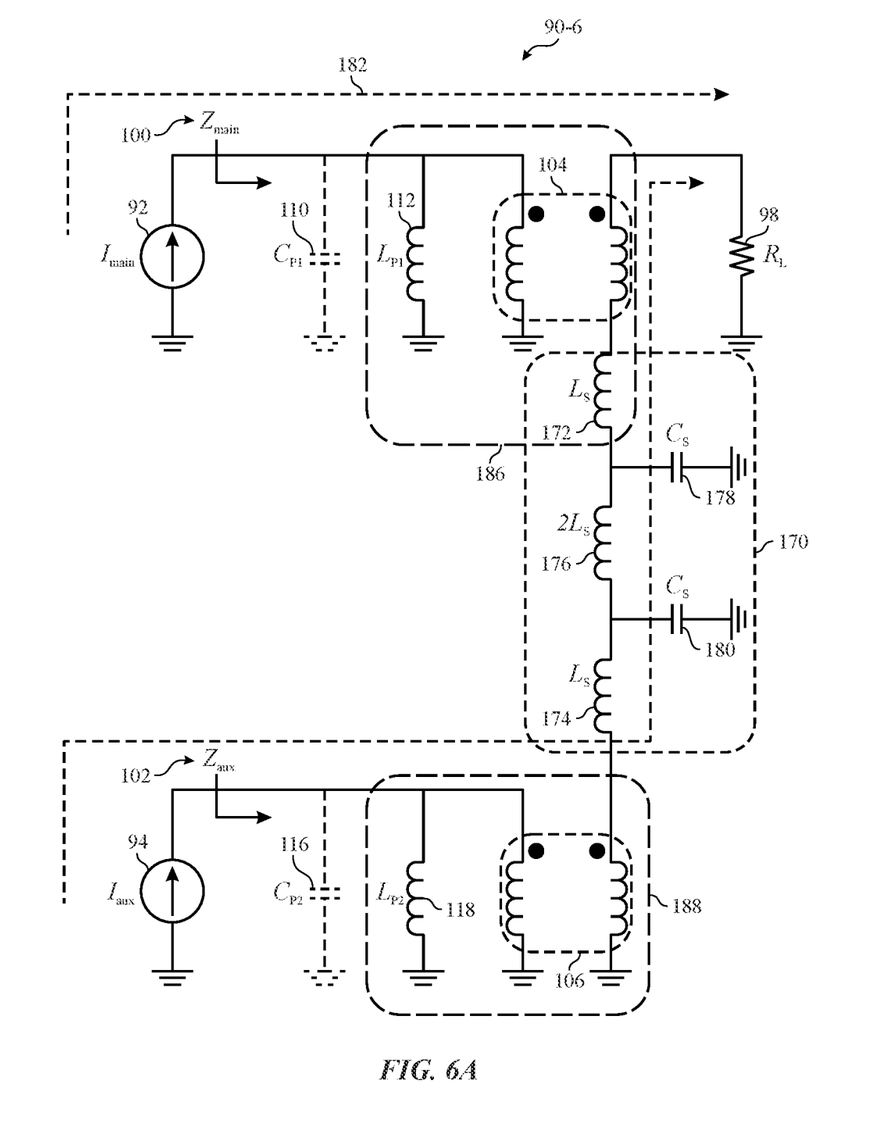
FIG. 6A is a schematic diagram of a series Doherty combiner of FIG. 4D having the impedance inverter implemented with two inductor-capacitor-inductor T-networks on the secondary inductor of the ideal transformers, according to embodiments of the present disclosure.
Figure 6B:
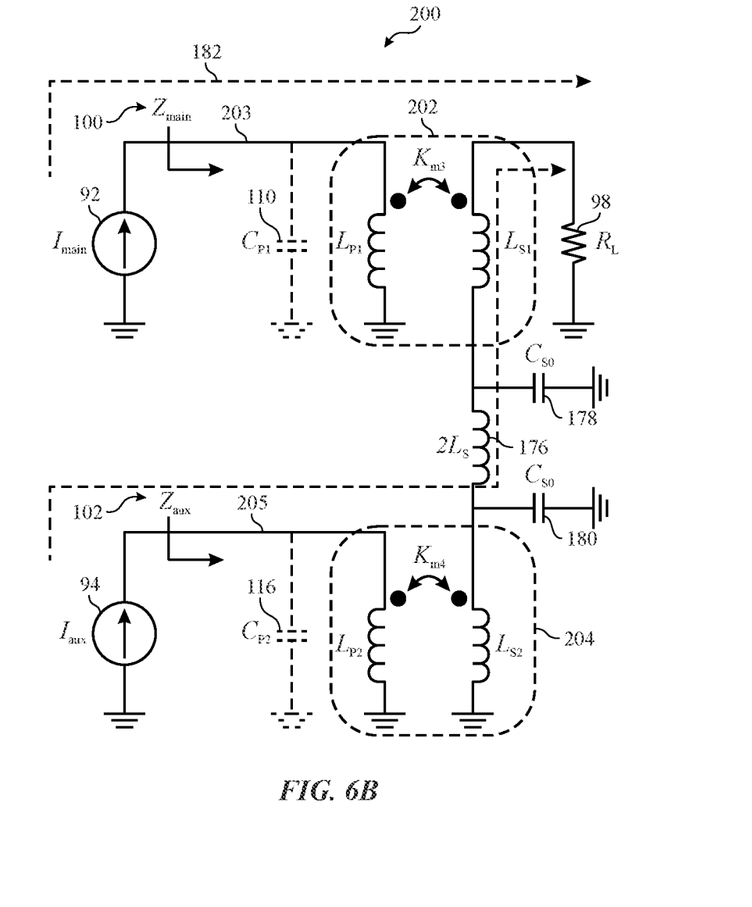
FIG. 6B is a second embodiment of a series Doherty power amplifier with transformers based on the series Doherty combiner of FIG. 6B including the two inductor-capacitor-inductor T-networks, according to embodiments of the present disclosure.

In different embodiments, the power amplifier 66 may include one or more series Doherty combiners and/or one or more Doherty power amplifiers with a number of inductor-capacitor-inductor T-networks (L-C-L T Network) forming single-ended and/or differential amplifiers. L-C-L T network may refer to a capacitor C being coupled to the two inductors L in parallel (e.g., coupled between the two inductors L). In particular, FIGS. 4A-4D depict schematic diagrams of embodiments of the power amplifier 66 including a series Doherty combiner. Moreover, FIGS. 5A and 5B depict schematic diagrams of embodiments of a Doherty power amplifier including an inductor-capacitor-inductor T-network. Furthermore, FIGS. 6A and 6B depict schematic diagrams of embodiments of a Doherty power amplifier including two inductor-capacitor-inductor T-networks.

Figure 4A:
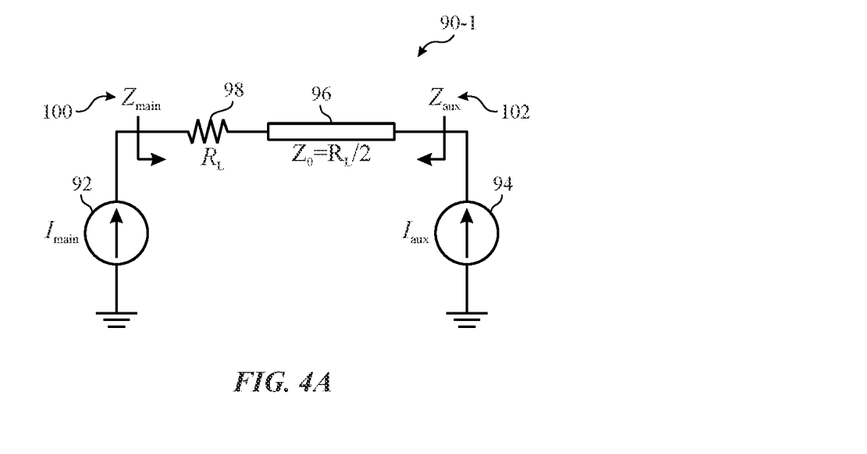
FIG. 4A is a schematic diagram of a power amplifier of the transmitter of FIG. 3 including a series Doherty combiner, according to embodiments of the present disclosure.

With the foregoing in mind, FIG. 4A is a schematic diagram of a series Doherty combiner 90-1. The series Doherty combiner 90-1 may include a main amplifier 92 (e.g., a first amplifier, a main power amplifier), an auxiliary amplifier 94 (e.g., a second amplifier, an auxiliary power amplifier), and an impedance inverter 96 coupled to a load 98. For example, the DAC 62 and/or the modulator 64 discussed above, among other things, may couple to the main amplifier 92 and the auxiliary amplifier 94 to provide the analog converted and/or modulated outgoing data 60 to the main amplifier 92 and the auxiliary amplifier 94. Moreover, the load 98 may include a number of the antennas 55 and/or the filter 68 discussed above, among other things.

The main amplifier 92 and the auxiliary amplifier 94 may each include any viable current amplification circuitry. The main amplifier 92 may output a first signal with a current $I_{main}$ and the auxiliary amplifier 94 may output a second signal with a current $I_{aux}$. As such, the load 98 may receive the amplified signal (e.g., a combined signal) to generate the transmitted signal 70 discussed above.

The load 98 is coupled in series to the main amplifier 92. Moreover, the load 98 is coupled in series to the auxiliary amplifier 94 via the impedance inverter 96. For example, the load 98 may have a resistance $R_L$ (e.g., 50 ohms). The impedance inverter 96 is coupled in series to the load 98 and the auxiliary amplifier 94. The impedance inverter 96 may include circuitry (e.g., transmission lines) to distribute an impedance of the load 98 between the main amplifier 92 and the auxiliary amplifier 94.

For example, the impedance inverter 96 may provide a common load $R_L$ to the main amplifier 92 and high impedance (e.g., open circuit condition) to the auxiliary amplifier 94. Alternatively or additionally, the impedance inverter 96 may provide a main impedance 100 ($Z_{main}$) (e.g., half of the resistance $R_L$, a first portion of the resistance $R_L$) to the main amplifier 92 and an auxiliary impedance 102 ($Z_{aux}$) (e.g., half of the resistance $R_L$, a remaining portion of the resistance $R_L$) to the auxiliary amplifier 94.

Figure 4B:
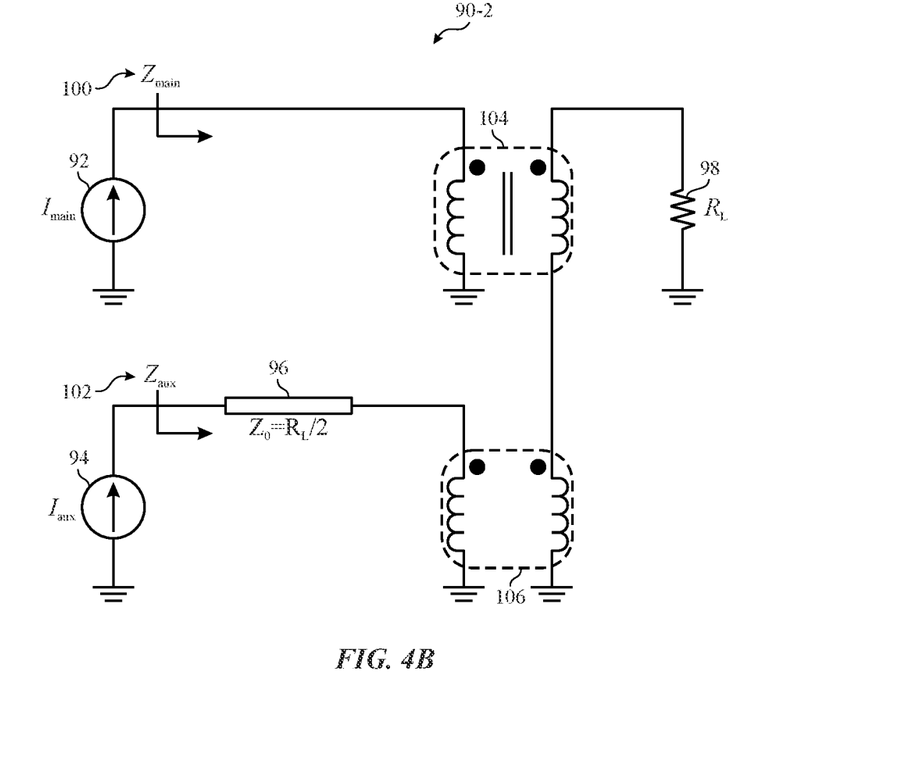
FIG. 4B a schematic diagram of a series Doherty combiner of FIG. 4A with ideal transformers and a shunt load, according to embodiments of the present disclosure.

FIG. 4B is a schematic diagram of a series Doherty combiner 90-2 including a first ideal transformer 104, a second ideal transformer 106 (e.g., nearly ideal transformers), and a shunt load 98. The main amplifier 92 is coupled to a primary inductor of the first ideal transformer 104. Moreover, the auxiliary amplifier 94 and the impedance inverter 96 are coupled to a primary inductor of the second ideal transformer 106. The load 98 may be coupled to a secondary inductor of the first ideal transformer 104. Furthermore, the secondary inductor of the first ideal transformer 104 may be coupled to a secondary inductor of the second ideal transformer 106 by a transmission line.

The series Doherty combiner 90-2 may include a first branch including the main amplifier 92 and the first ideal transformer 104 coupled to the load 98. The series Doherty combiner 90-2 may also include a second branch including the auxiliary amplifier 94, the impedance inverter 96, and the second ideal transformer 106 coupled to the load 98. As such, the load 98 is coupled in series to the first branch and is coupled in series to the second branch. Moreover, the load 98 is coupled in shunt to the main amplifier 92, the first ideal transformer 104, the auxiliary amplifier 94, and the second ideal transformer 106.

The first ideal transformer 104 may have a transformation ratio of 1:$n_1 k_{m1}$, where $n_1$ may be a first number of transformer turns and $k_{m1}$ may be a first coupling coefficient. Similarly, the second ideal transformer 106 may have a transformation ratio of 1:$n_2 k_{m2}$, where $n_2$ may be a second number of transformer turns and $k_{m2}$ may be a second coupling coefficient.

Figure 4C:
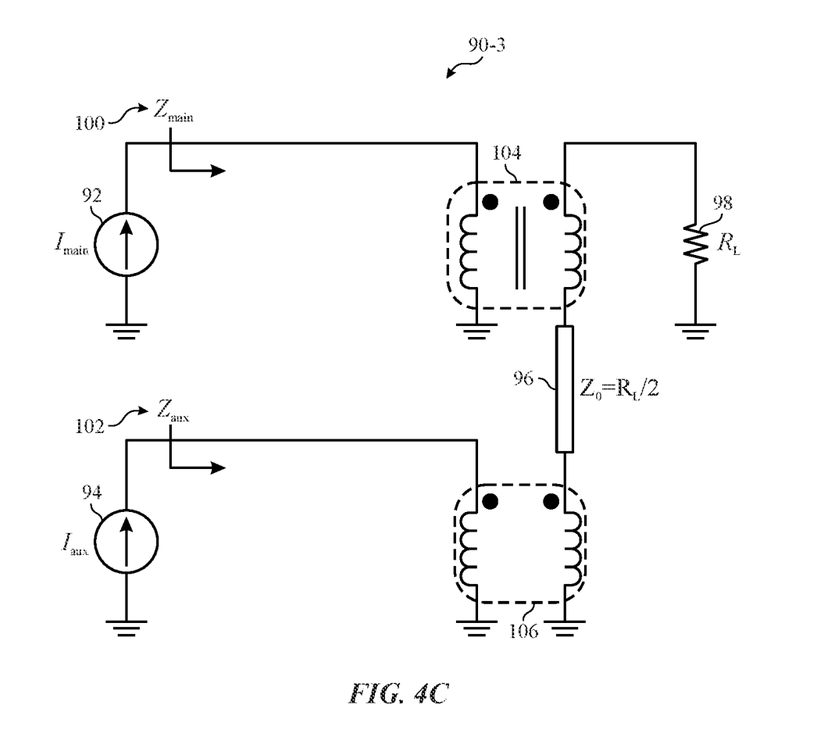
FIG. 4C is a schematic diagram of a series Doherty combiner of FIG. 4B having an impedance inverter moved to a secondary inductor of the ideal transformers, according to embodiments of the present disclosure.

FIG. 4C is a schematic diagram of a series Doherty combiner 90-3 with the impedance inverter 96 being coupled to the secondary inductor of the first ideal transformer 104 and the second ideal transformer 106. For example, the impedance inverter 96 is moved from the primary inductor of the second ideal transformer 106 to the secondary inductor of the second ideal transformer 106. As such, the secondary inductor of the second ideal transformer 106 is coupled to the secondary inductor of the first ideal transformer via the impedance inverter 96.

Figure 4D:
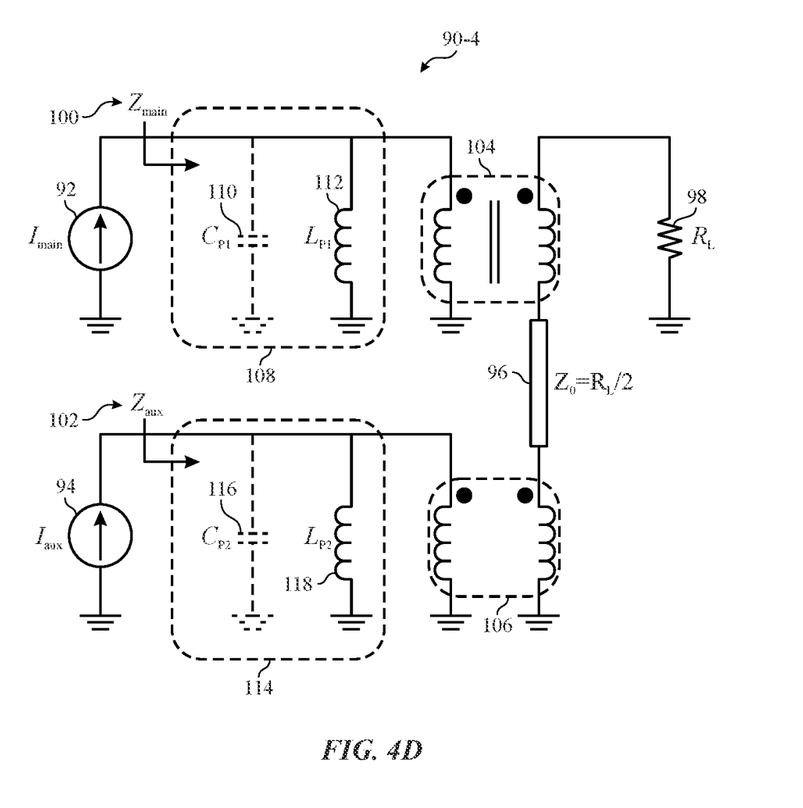
FIG. 4D is a schematic diagram of a series Doherty combiner of FIG. 4C having resonant circuits on a primary inductor of the ideal transformers, according to embodiments of the present disclosure.

FIG. 4D is a schematic diagram of a series Doherty combiner 90-4 including resonant circuits disposed on the primary inductor of the first ideal transformer 104 and the second ideal transformer 106. Similar to FIG. 4C, the impedance inverter 96 is coupled to the secondary inductor of the ideal transformers 104 and 106 such that the second ideal transformer 106 is coupled to the first ideal transformer via the impedance inverter 96. In the depicted embodiments, a first resonant circuit 108 may include a first parasitic capacitor 110 and a first inductor 112 coupled in parallel to the main amplifier 92. Moreover, a second resonant circuit 114 may include a second parasitic capacitor 116 and a second inductor 118 coupled in parallel to the auxiliary amplifier 94.

The first parasitic capacitor 110 and the second parasitic capacitor 116 may have parasitic capacitance values $C_{P1}$ and/or $C_{P2}$. In some cases, the series Doherty combiners 90-1, 90-2, and 90-3 discussed above may also include the parasitic capacitors 110 and/or 116 having similar or different capacitance values. The series Doherty combiner 90-4 may include the first inductor 112 coupled in parallel to the first parasitic capacitor 110 to generate the first resonant circuit 108. The first inductor 112 may have an inductance value $L_{P1}$. In some embodiments, the first inductance value $L_{P1}$ may be selected based on the first capacitance value $C_{P1}$ of the main amplifier 92.

Moreover, the series Doherty combiner 90-4 may include the second inductor 118 coupled in parallel to the second parasitic capacitor 116 to generate the second resonant circuit 114. The second inductor 118 may have an inductance value $L_{P2}$. In some embodiments, the second inductance value $L_{P2}$ may be selected based on the second capacitance value $C_{P2}$ of the auxiliary amplifier 94.

In some cases, the first resonant circuit 108 may at least partially remove (e.g., absorb) an undesired portion of the first signal. For example, the undesired portion of the first signal may correspond to an induced effect of the parasitic capacitance $C_{P1}$ on the first signal. Similarly, the second resonant circuit 114 may at least partially remove (e.g., absorb) an undesired portion of the second signal. For example, the undesired portion of the second signal may correspond to an induced effect of the parasitic capacitance $C_{P2}$ on the second signal. As such, at least in some cases, the first resonant circuit 108 and/or the second resonant circuit 114 may reduce an undesired effect of the parasitic capacitance values $C_{P1}$ and/or $C_{P2}$ on the amplified signal (e.g., the combined signal) and/or transmitted signal 70 discussed above.

FIG. 5A is a schematic diagram of a series Doherty combiner 90-5 having the impedance inverter 96 implemented with an inductor-capacitor-inductor (L-C-L) T-network 130 on the secondary inductor of the ideal transformers 106 and 106. The inductor-capacitor-inductor T-network 130, hereinafter referred to as the T-network 130, may include a first series inductor 132 coupled to the first ideal transformer 104. The T-network 130 may include a second series inductor 134 coupled to the second ideal transformer 106. Moreover, the T-network 130 may include a shunt capacitor 136 coupled to the first series inductor 132 and the second series inductor 134. The shunt capacitor 136 may have a capacitance value $C_{S0}$. In the depicted embodiment, the first series inductor 132 and the second series inductor 134 may each have an inductance value $L_{S0}$. In some cases, a characteristic impedance of the T-network 130 may be equal to or near half of a resistance $R_L$ of the load 98.

The series Doherty combiner 90-5 may have a first current path 138 associated with the main amplifier 92. For example, the first current path 138 may correspond to a current flow direction from the main amplifier 92 through the first ideal transformer 104 to the load 98. Moreover, the series Doherty combiner 90-5 may have a second current path 140 associated with the auxiliary amplifier 94. For example, the second current path 140 may correspond to a current flow direction from the auxiliary amplifier 94 through the second ideal transformer 106 and the secondary inductor of the first ideal transformer 104 to the load 98.

A first transformer model 142 may include the first inductor 112, the first series inductor 132, and the first ideal transformer 104. For example, the first transformer model 142 may correspond to a physical transformer model having a leakage inductance and a magnetizing inductance. In some cases, the inductance value $L_{S0}$ of the first series inductor 132 may correspond to (e.g., nearly equal to) a leakage inductance value of the first transformer model 142. Moreover, the inductance value $L_{P1}$ of the first inductor 112 may correspond to (e.g., nearly equal to) a magnetizing inductance value of the first transformer model 142.

A second transformer model 144 may include the second inductor 118, the second series inductor 134, and the second ideal transformer 106. Similar to the first transformer model 142, the second transformer model 144 may correspond to a physical transformer model with a leakage inductance and a magnetizing inductance. In some cases, the inductance value $L_{S0}$ of the second series inductor 134 may correspond to (e.g., nearly equal to) a leakage inductance value of the second transformer model 144. Moreover, the inductance value $L_{P2}$ of the second inductor 118 may correspond to (e.g., nearly equal to) a magnetizing inductance value of the second transformer model 144.

FIG. 5B is a schematic diagram of a first embodiment of a series Doherty power amplifier 160 with two transformers coupling to the load 98. In particular, the Doherty power amplifier 160 may include a first transformer 162 based on the first transformer model 142 and a second transformer 164 based on the second transformer model 144 discussed above. The main amplifier 92 may output the first signal through the first transformer 162 via the first current path 138. Moreover, the auxiliary amplifier 94 may output the second signal through the second transformer 164 and the secondary inductor of the first transformer 162 via the second current path 140.

In the depicted embodiment, the Doherty power amplifier 160 may include the main amplifier 92 coupled to a primary inductor of the first transformer 162. For example, the primary inductor of the first transformer 162 is coupled to (e.g., directly coupled to, with no intermediary components) the main amplifier 92 via a first node 165. The main amplifier 92 may also include the first parasitic capacitor 110.

Moreover, the Doherty power amplifier 160 may include the auxiliary amplifier 94 coupled to a primary inductor of the second transformer 164. For example, the primary inductor of the second transformer 164 is coupled to (e.g., directly coupled to, with no intermediary components) to the auxiliary amplifier 94 via a second node 167. The auxiliary amplifier 94 may also include the second parasitic capacitor 116.

As mentioned above, the first parasitic capacitor 110 is associated with parasitic capacitance $C_{P1}$ of the main amplifier 92 and the second parasitic capacitor 116 is associated with parasitic capacitance $C_{P2}$ of the auxiliary amplifier 94. Moreover, the shunt capacitor 136 is coupled to the first transformer 162 and the second transformer 164. Furthermore, the load 98 is coupled to a secondary inductor of the first transformer 162. secondary inductor For example, a primary inductor of the first transformer 162 may include the first inductor 112 combined with a primary inductor of the first ideal transformer 104 discussed above. Moreover, a secondary inductor of the first transformer 162 may include the first series inductor 132 of the T-network 130 combined with a secondary inductor of the first ideal transformer 104. A parametric optimum load impedance $R_{opt}$ of the main amplifier 92 may be determined based on the target output power, supply voltage, and process technology (e.g., process variations). A magnetic coupling coefficient $k_{m1}$ of the first transformer 162 may be selected and/or determined based on metal stack option of the process technology. Moreover, a turn ratio $n_1$ of the first transformer 162 may be determined based on equation 1:

$$n_1 = \frac{1}{k_{m1}} \sqrt{\frac{R_L}{2R_{opt}}} \qquad \text{Equation 1}$$

A primary self-inductance $L_{P1}$ of the first transformer 162 may be determined based on equation 2:

$$L_{P1} = \frac{R_{opt} k_{m1}^2}{\omega_0 (1 - k_{m1}^2)} \qquad \text{Equation 2}$$

A secondary self-inductance $L_{S1}$ of the first transformer 162 may be determined based on equation 3:

$$L_{S1} = \frac{R_L}{2\omega_0^2 (1 - k_{m1}^2)} \qquad \text{Equation 3}$$

The first capacitance value $C_{P1}$ of the first parasitic capacitor 110 may be determined based on equation 4:

$$C_{P1} = \frac{1}{\omega_0^2 L_{P1}} = \frac{1 - k_{m1}^2}{\omega_0 R_{opt} k_{m1}^2} \qquad \text{Equation 4}$$

Furthermore, the capacitance value $C_{S0}$ of the shunt capacitor 136 may be determined based on equation 5:

$$C_{S0} = \frac{2}{\omega_0 R_L} \qquad \text{Equation 5}$$

Moreover, a primary inductor of the second transformer 164 may include the second inductor 118 combined with a primary inductor of the second ideal transformer 106. A secondary inductor of the second transformer 164 may also include the second series inductor 134 of the T-network 130 combined with a secondary inductor of the second ideal transformer 106. In some cases, the resulting secondary inductor of the first transformer 162, the secondary inductor of the second transformer 164, and the shunt capacitor 136 may form an impedance inverting circuit. As such, an output signals of the first transformer 162 and the second transformer 164 may be combined to provide an output signal of the Doherty power amplifier 160 to the load 98.

For example, a parametric optimum load impedance $R_{opt}$ of the auxiliary amplifier 94 may be determined based on the target output power, supply voltage, and process technology (e.g., process variations). A magnetic coupling coefficient $k_{m2}$ of the second transformer 164 may be selected and/or determined based on metal stack option of the process technology.

Moreover, a turn ratio $n_2$ of the second transformer 164 may be determined based on equation 6:

$$n_2 = \frac{1}{k_{m2}}\sqrt{\frac{R_L}{2R_{opt}}}$$ Equation 6

A primary self-inductance $L_{P2}$ of the second transformer 164 may be determined based on equation 7:

$$L_{P2} = \frac{R_{opt}k_{m2}^2}{\omega_0(1-k_{m2}^2)}$$ Equation 7

In some embodiments, the primary self-inductance $L_{P1}$ and the primary self-inductance $L_{P1}$ discussed above may be equal, nearly equal, or otherwise correspond to one another. A leakage inductance $L_{S2}$ of the second transformer 164 may be determined based on equation 8:

$$L_{S2} = \frac{R_L}{2\omega_0^2(1-k_{m2}^2)}$$ Equation 8

In some embodiments, the secondary self-inductance $L_{S1}$ of the first transformer 162 and the secondary self-inductance $L_{S2}$ of the second transformer 164 may be equal, nearly equal, or otherwise correspond to one another. Moreover, the second capacitance value $C_{P2}$ of the second parasitic capacitor 116 may be determined based on equation 9:

$$C_{P2} = \frac{1}{\omega_0^2 L_{P2}} = \frac{1-k_{m2}^2}{\omega_0 R_{opt} k_{m2}^2}$$ Equation 9

The Doherty power amplifier 160 may generate (e.g., output, amplify) signals at high frequency (e.g., millimeter Wave (mmWave) frequencies, such as between 30 gigahertz (GHz) and 300 GHz). Moreover, in different embodiments, the first transformer 162 and/or the second transformer 164 may have different inductance values resulting in generating (e.g., outputting, amplifying) the signals at different frequency channels (e.g., 24-30 GHZ, 37-49 GHZ, higher than 50 GHz, among other possibilities). In specific embodiments, the Doherty power amplifier 160 may generate the transmitted signal 70 having a frequency over a wider frequency range (e.g., broad frequency band). Furthermore, in some cases, the Doherty power amplifier 160 may have a reduced size based on including a reduced number of components (e.g., capacitors) and/or reduced size components (e.g., reduced size of inductors and capacitors).

In some embodiments, the Doherty power amplifier 160 may have reduced size and improved efficiency at normal power mode and/or power back-off mode compared to other power amplifiers. For example, the Doherty power amplifier 160 may use lower power to provide an output signal (e.g., when operating at power back-off mode), such as the amplified signal and/or the transmitted signal 70, when compared to other power amplifiers. In some cases, at the power back-off mode, the Doherty power amplifier 160 may generate the output signal with the improved efficiency based on consuming reduced electrical power corresponding to a reduction in the output power. In alternative or additional cases, the improved efficiency may at least in part be based on the reduced effect of parasitic capacitance values (e.g., $C_{P1}$, $C_{P2}$) discussed above.

In some cases, the Doherty power amplifier 160 may also have lower peak-to-average power ratio (PAPR) compared to other power amplifiers. As such, the Doherty power amplifier 160 may have the improved linearity at normal power mode and power back-off mode. For example, the improved linearity at normal power mode and/or the power back-off mode may be based on the reduced effect of parasitic capacitance values (e.g., $C_{P1}$, $C_{P2}$) discussed above, among other things.

FIG. 6A is a schematic diagram of a series Doherty combiner 90-6 having the impedance inverter 96 implemented with two inductor-capacitor-inductor (L-C-L) T-networks 170 on the secondary inductor of the ideal transformers 106 and 106. The two inductor-capacitor-inductor T-networks 170 (e.g., two equivalent L-C-L networks) are hereinafter referred to as the T-networks 170. The T-networks 170 may include a first series inductor 172 coupled to the first ideal transformer 104, a second series inductor 174 coupled to the second ideal transformer 106, and a third series inductor 176 coupled to the first series inductor 172 and the second series inductor 174. Moreover, the T-networks 170 may include a first shunt capacitor 178 coupled to the first series inductor 172 and the third series inductor 176 and a second shunt capacitor 180 coupled to the second series inductor 174 and the third series inductor 176.

In the depicted embodiment, the first series inductor 172 and the second series inductor 174 may each have an inductance value $L_S$. Moreover, the third series inductor 176 may have an inductance value $2L_S$. For example, the third series inductor 176 may have an inductance value approximately near (in ±10% proximity of) double that of the inductance value of the first series inductor 172 and the second series inductor 174. In some cases, a characteristic impedance of the T-networks 170 may be equal to or near half of a resistance $R_L$ of the load 98. The series Doherty combiner 90-6 may have a first current path 182 corresponding to a current flow direction from the main amplifier 92 to the load 98. Moreover, the series Doherty combiner 90-5 may have a second current path 184 corresponding to a current flow direction from the auxiliary amplifier 94 to the load 98.

A third transformer model 186 may include the first inductor 112, the first series inductor 172, and the first ideal transformer 104. Similar to the first and second transformer models 142 and 144 discussed above, the third transformer model 186 may correspond to a physical transformer model with a leakage inductance and a magnetizing inductance. In some cases, the inductance value $L_S$ of the first series inductor 172 may correspond to (e.g., nearly equal to) a leakage inductance value of the third transformer model 186. Moreover, the inductance value $L_{P1}$ of the first inductor 112 may correspond to (e.g., nearly equal to) a magnetizing inductance value of the third transformer model 186.

Moreover, a fourth transformer model 188 may include the second inductor 118, the second series inductor 174, and the second ideal transformer 106. Similarly, the fourth transformer model 188 may correspond to a physical transformer model with a leakage inductance and a magnetizing inductance. In some cases, the inductance value $L_S$ of the second series inductor 174 may correspond to (e.g., nearly equal to) a leakage inductance value of the fourth transformer model 188. Moreover, the inductance value $L_{P2}$ of the second inductor 118 may correspond to (e.g., nearly equal to) a magnetizing inductance value of the fourth transformer model 188.

FIG. 6B is a schematic diagram of a second embodiment of a Doherty power amplifier 200. In particular, the Doherty power amplifier 200 may include a third transformer 202 based on the third transformer model 186 and a fourth transformer 204 based on the fourth transformer model 188 discussed above. The main amplifier 92 may output the first signal through the third transformer 202 via the first current path 182. Moreover, the auxiliary amplifier 94 may output the second signal through the fourth transformer 204 and a secondary portion of the third transformer 202 via the second current path 184.

In the depicted embodiment, the Doherty power amplifier 200 may include the main amplifier 92 coupled to (e.g., directly coupled to, without an intermediary component) a primary inductor of the third transformer 202 via a first node 203. The main amplifier 92 may also include the first parasitic capacitor 110. The Doherty power amplifier 200 may include the auxiliary amplifier 94 coupled to (e.g., directly coupled to, without an intermediary component) the primary inductor of the fourth transformer 204 via a second node 205. The Doherty power amplifier 200 may also include the second parasitic capacitor 116.

Moreover, the third series inductor 176 may couple to the secondary inductors of the third transformer 202 and the fourth transformer 204. The first shunt capacitor 178 is coupled to the third transformer 202 and the third series inductor 176. The second shunt capacitor 180 is coupled to the fourth transformer 204 and the third series inductor 176. Moreover, the load 98 is coupled to a secondary inductor of the third transformer 202.

For example, a primary inductor of the third transformer 202 may include the first inductor 112 combined with a primary inductor of the first ideal transformer 104. Moreover, a secondary inductor of the third transformer 202 may include the first series inductor 172 of the T-networks 170 combined with a secondary inductor of the first ideal transformer 104. For example, a magnetic coupling coefficient $k_{m3}$ of the third transformer 202 may be selected and/or determined based on, for example, metal stack option of the process technology.

A primary inductor of the fourth transformer 204 may include the second inductor 118 combined with a primary inductor of the second ideal transformer 106. Moreover, a secondary inductor of the fourth transformer 204 may include the second series inductor 174 of the T-networks 170 combined with a secondary inductor of the second ideal transformer 106. For example, a magnetic coupling coefficient $k_{m4}$ of the fourth transformer 204 may be selected and/or determined based on, for example, metal stack option of the process technology.

The Doherty power amplifier 200 may provide technical improvements for generating the amplified signal and/or the transmitted signal 70 similar to technical improvements of the Doherty power amplifier 160 discussed above. For example, the electronic device 10 may include the power amplifier 66 including the Doherty power amplifiers 160 and/or 200 to transmit signals at wide-band applications such as multi-channel communication over millimeter Wave (mmWave) frequencies. In some embodiments, the electronic device 10 may transmit the signals at multiple frequency channels (e.g., 24-30 gigahertz (GHz), 37-49 GHz, higher than 50 GHz, among other possibilities). Moreover, the power amplifier may have reduced size and improved efficiency and linearity at power back-off mode compared to other power amplifiers.

It should be appreciated that the embodiments of the Doherty power amplifiers 160 and 200 are provided as example embodiments. That is, in alternative or additional embodiments, the power amplifier 66 may include Doherty power amplifiers with alternative or additional circuitry. For example, the series Doherty combiners 90-5 and/or 90-6 may include the impedance inverter 96 implemented with more than two inductor-capacitor-inductor (L-C-L) T-networks.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform] ing [a function] . . . " or "step for [perform] ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A power amplifier circuit comprising:
   a first branch comprising
      a first amplifier, and
      a first transformer coupled to the first amplifier via a first node,
   a second branch comprising
      a second amplifier, and
      a second transformer coupled to the second amplifier via a second node and coupled to the first transformer;
   a series inductor coupled to the first transformer and the second transformer;
   a first shunt capacitor coupled to the first transformer and the series inductor; and
   a second shunt capacitor coupled to the second transformer and the series inductor.

2. The power amplifier circuit of claim 1, wherein the first transformer comprises a first primary inductor and a first secondary inductor configured to inductively couple to form a first current path to a load.

3. The power amplifier circuit of claim 2, wherein the first primary inductor is coupled to the first amplifier.

4. The power amplifier circuit of claim 2, wherein the first secondary inductor is configured to couple to the load.

5. The power amplifier circuit of claim 1, wherein the second transformer comprises a second primary inductor and a second secondary inductor configured to inductively couple to form a second current path to a load.

6. The power amplifier circuit of claim 5, wherein the second primary inductor is coupled to the second amplifier.

7. The power amplifier circuit of claim 5, wherein the second secondary inductor is coupled to the first transformer via the series inductor, the first transformer being coupled to the load.

8. The power amplifier circuit of claim 1, wherein the first shunt capacitor is coupled to a secondary inductor of the first transformer and the series inductor.

9. The power amplifier circuit of claim 8, wherein the series inductor, the first shunt capacitor, the second shunt capacitor, the secondary inductor of the first transformer, and the secondary inductor of the second transformer form an impedance inverting circuit.

10. An electronic device comprising:
one or more antennas; and
a power combiner circuit comprising
a first branch comprising
a first amplifier, and
a first transformer coupled to the first amplifier via a first node, the first transformer coupled to the one or more antennas,
a second branch comprising
a second amplifier, and
a second transformer coupled to the second amplifier via a second node and coupled to the first transformer,
a series inductor coupled to the first transformer and the second transformer,
a first shunt capacitor coupled to the first transformer and the series inductor, and
a second shunt capacitor coupled to the second transformer and the series inductor.

11. The electronic device of claim 10, wherein the first transformer comprises a first primary inductor and a first secondary inductor being configured to inductively couple to form a first current path to a load, the first primary inductor being coupled to the first amplifier, and the first secondary inductor being coupled to the one or more antennas.

12. The electronic device of claim 10, wherein the second transformer comprises a second primary inductor and a second secondary inductor being configured to inductively couple to form a second current path to a load, the second primary inductor being coupled to the second amplifier, and the second secondary inductor being coupled to the first transformer via the series inductor.

13. The electronic device of claim 10, comprising a filter, the first transformer configured to couple to the one or more antennas via the filter.

14. The electronic device of claim 10, comprising a digital-to-analog converter coupled to the first amplifier and the second amplifier.

15. A power combiner circuit comprising:
a first branch comprising
a first amplifier, and
a first transformer coupled to the first amplifier via a first node,
a second branch comprising
a second amplifier, and
a second transformer coupled to the second amplifier via a second node and coupled to the first transformer;
a series inductor coupled to the first transformer and the second transformer;
a first shunt capacitor coupled to the first transformer and the series inductor; and
a second shunt capacitor coupled to the second transformer and the series inductor.

16. The power combiner circuit of claim 15, wherein the first transformer comprises a first primary inductor and a first secondary inductor, and the second transformer comprises a second primary inductor and a second secondary inductor.

17. The power combiner circuit of claim 16, wherein an inductance value of the first secondary inductor corresponds to an inductance value of the second secondary inductor when the power combiner circuit is in operation.

18. The power combiner circuit of claim 17, wherein an inductance value of the series inductor corresponds to an inductance value of the first secondary inductor and the second secondary inductor when the power combiner circuit is in operation.

19. The power combiner circuit of claim 16, wherein the first primary inductor is coupled to the first amplifier, the second primary inductor is coupled to the second amplifier, and the second secondary inductor is coupled to the first secondary inductor.

20. The power combiner circuit of claim 15, wherein the first shunt capacitor is coupled to a secondary inductor of the first transformer and the series inductor, and the second shunt capacitor is coupled to a secondary inductor of the second transformer and the series inductor.

* * * * *